United States Patent [19]

Meitzler et al.

[11] 4,361,951

[45] Dec. 7, 1982

[54] METHOD OF FABRICATING A TITANIUM DIOXIDE RECTIFIER

[75] Inventors: Allen H. Meitzler, Ann Arbor; William T. Donlon, Jr., Detroit; Samuel S. Shinozaki, Livonia, all of Mich.

[73] Assignee: Ford Motor Company, Dearborn, Mich.

[21] Appl. No.: 256,412

[22] Filed: Apr. 22, 1981

[51] Int. Cl.³ .............................................. H01L 21/20
[52] U.S. Cl. ........................................ 29/585; 148/6.3; 427/82
[58] Field of Search .......................... 29/584, 585, 586; 427/79, 80, 82, 88, 89; 252/62.3 BT, 518, 520; 338/20, 21, 325; 148/6.3; 357/10, 61

[56] References Cited

U.S. PATENT DOCUMENTS

| 2,699,522 | 1/1955 | Breckenridge | 427/82 |
|---|---|---|---|
| 2,749,596 | 6/1956 | Breckenridge | 29/586 |
| 2,766,509 | 10/1956 | Loup et al. | 357/10 X |
| 2,812,273 | 11/1957 | Shilliday et al. | 148/6.3 |
| 2,887,633 | 5/1959 | Shilliday et al. | 357/10 |
| 3,100,849 | 8/1963 | Hollander, Jr. | 357/10 |
| 3,351,500 | 11/1967 | Khouri | 357/10 |
| 3,441,517 | 4/1969 | Brauer et al. | 357/10 |
| 3,679,949 | 6/1972 | Uekusa et al. | 357/10 |
| 3,686,096 | 8/1972 | Hed et al. | 357/10 |
| 3,872,359 | 3/1975 | Feuersanger | 357/10 |
| 3,972,059 | 7/1976 | DiStefano | 357/10 |

Primary Examiner—L. Dewayne Rutledge
Assistant Examiner—David A. Hey
Attorney, Agent, or Firm—Peter Abolins; Clifford L. Sadler

[57] ABSTRACT

This specification discloses a method of fabricating a titanium rectifier circuit element. A titanium dioxide main body is formed with a pair of spaced faces each of which having thereon a platinum electrode. A dc voltage is applied across this structure, heating the structure to a temperature of about 750°–850° C. In this temperature range, the titanium dioxide body is subjected to a cyclic sequence of exposures to oxidizing and reducing atmospheres. The final step includes cooling down the titanium dioxide body in the presence of a reducing atmosphere with an applied dc electric field.

4 Claims, 9 Drawing Figures

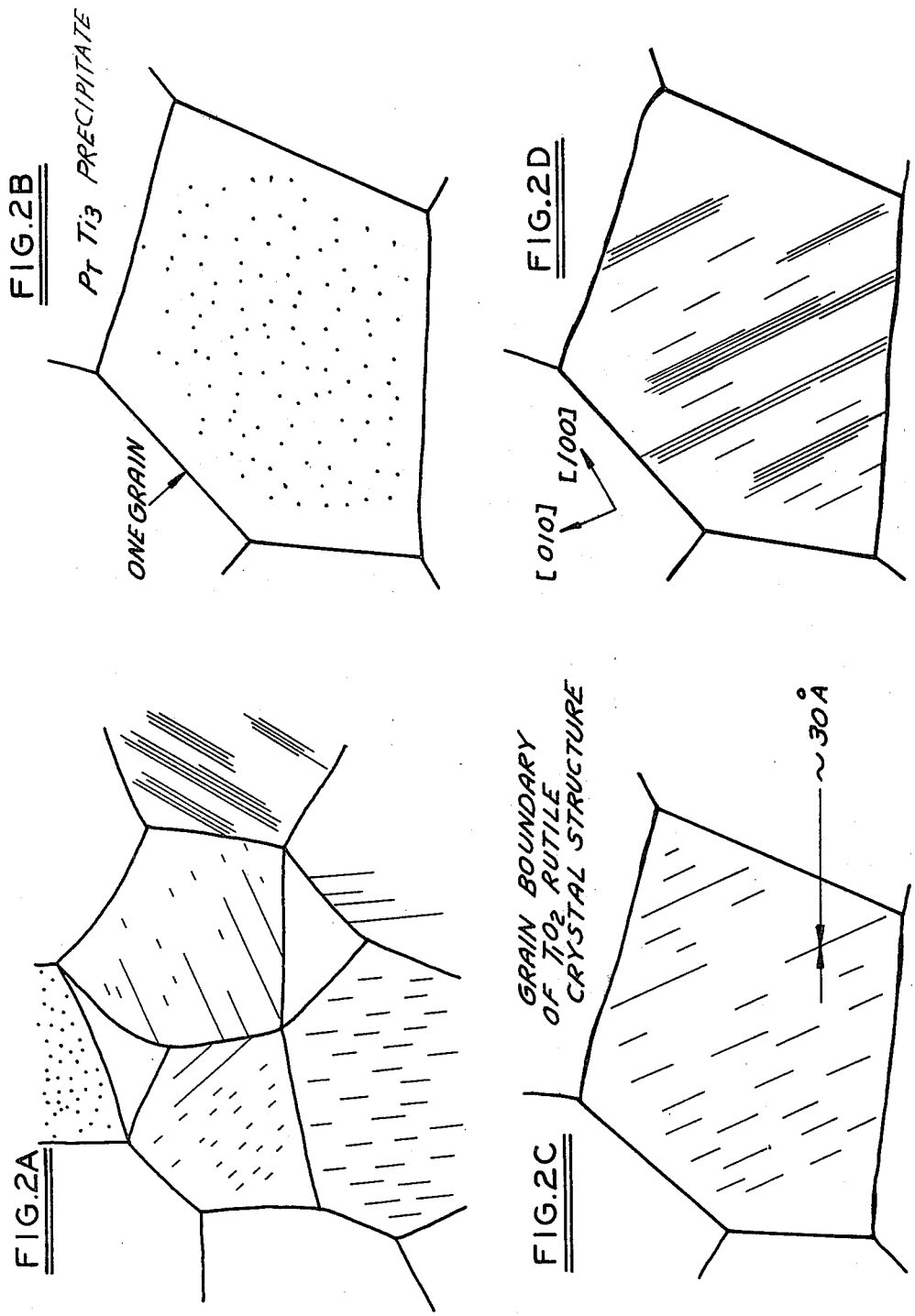

METHOD OF FABRICATING A TITANIUM DIOXIDE RECTIFIER

BACKGROUND OF THE INVENTION

1. Field of the Invention

This invention relates to fabrication of rectifiers for electric current.

2. Prior Art

Known rectifiers can be made of material such as galena, selenium, copper oxide and germanium. Although rectifiers containing these materials are useful for many purposes, they are not generally satisfactory in high temperature operation. For example, selenium rectifiers are not satisfactory at temperatures over 125° C., copper oxide is not satisfactory at temperatures at over 85° to 90° C. Galena is unsatisfactory at over 70° C. and germanium is unsatisfactory over 90° C.

Nevertheless, there are applications where high temperature rectifiers are required. For example, in some automotive applications the temperature in and around the engine exhaust is relatively high and there is a need for rectifying electrical circuit elements. Without the ability to endure such high temperature, the rectification components impose serious constraints on the design and must typically be positioned in the passenger compartment. This, of course, undesirably adds to the cost and complexity of the system.

The prior art also teaches titanium dioxide rectifiers which can perform rectification at temperatures in excess of 200° C. However, the structure and method of manufacture disclosed in U.S. Pat. Nos. 2,699,522 and 2,887,633 have an undesirable complexity. The structure taught in both patents utilizes a titanium dioxide ceramic between dissimilar electrode material thus forming an asymmetrical structure with respect to choice of electrode materials. The cause of rectification can be described in terms of Schottky boundary layers between a semiconductor ceramic and a dissimilar electrode. In U.S. Pat. No. 2,887,633 there is taught coating an inorganic artificial barrier material on a titanium dioxide semiconductor. The coating is obtained by vaporizing silicon monoxide in a vacuum and condensing the vapor on the surface of the semiconducting titanium dioxide. An alternative solution both in structure and method would be desirable for achieving a high temperature rectifier.

SUMMARY OF THE INVENTION

This specification discloses a method of fabricating a titanium rectifier circuit element including the steps of forming a structure with a titanium dioxide main body with a pair of spaced faces and a platinum electrode on each of the spaced faces. Additional steps include applying a dc voltage across the structure, heating the structure to a temperature of about 750°–850° C., applying an oxidizing atmosphere, applying a reducing atmosphere, and cooling the structure.

Such a rectifier has a symmetrical configuration (with respect to choice of electrode materials) with platinum electrodes attached to a titanium dioxide main body. Further, in contrast to rectification caused by Schottky boundary layers, the cause of rectification is a microstructure that results from a combination of circumstances; (1) the presence of platinum, (2) the presence of an electrical ordering field, (3) the presence of a crystallographic shear phenomenon in titanium dioxide, (4) a heat treatment that causes platinum to diffuse into the rutile grains in substantial concentrations and react with titanium to produce microscopic layer defects of PtTi$_3$, which may be nucleated along crystallographic shear planes, but grown with epitaxial relation to the titanium dioxide substrate in the [100] direction.

BRIEF DESCRIPTION OF THE DRAWINGS

FIGS. 2a, 2b, 2c and 2d are schematic representations of the structure of a platinum doped titanium dioxide ceramic during growth of a PtTi$_3$ microstructure in accordance with an embodiment of this invention.

DETAILED DESCRIPTION OF THE INVENTION

Figure 1:
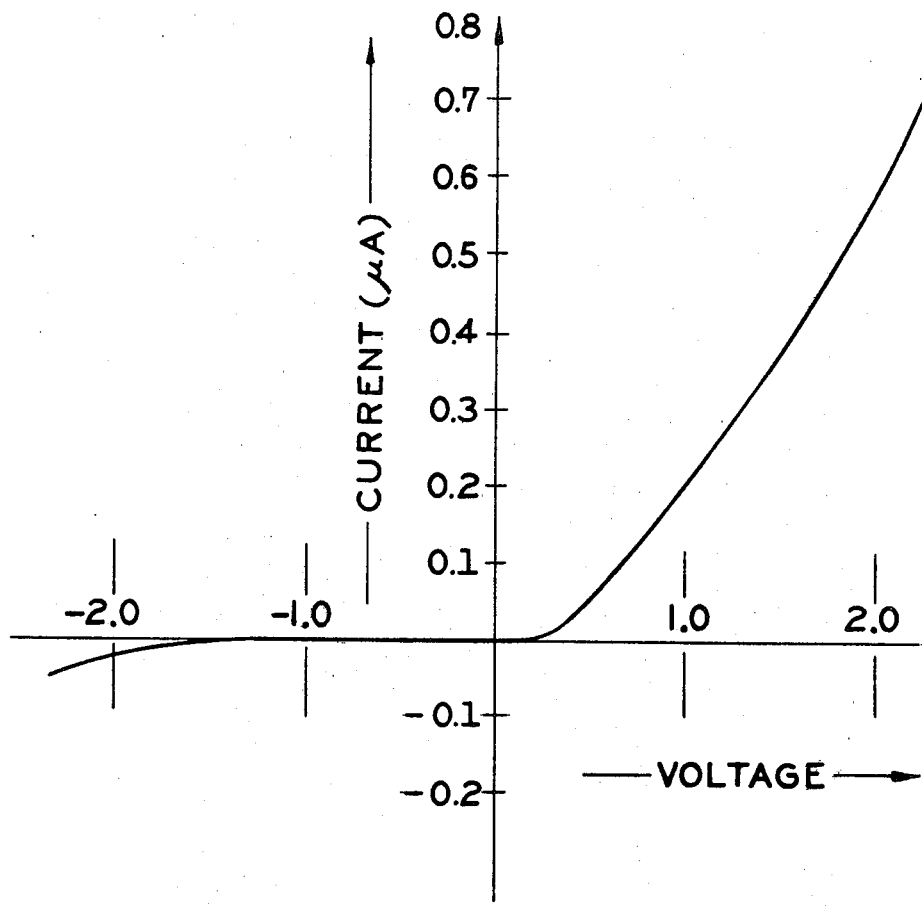
FIG. 1 is graphical representation of current versus voltage characteristics of a rectifier in accordance with an embodiment of this invention.

Fabrication of a rectifier in accordance with an embodiment of this invention, includes formation of porous, fine grain, polycrystalline titanium dioxide ceramic pellets, approximately 3 mm in diameter and 1 mm thick, with two fine (200 microns) embedded leads of platinum wire. The ceramic in the pellet is titanium dioxide in the form of rutile, fabricated by a process that produced a ceramic body having a desity of approximately 60% of theoretical and a grain size in the range of 2 to 10 microns. Rutile, a high purity, stoichiometric, single crystal, is a wide band gap semiconductor with a band gap energy in the range of 3 to 4 eV. If exposed to a reducing gas (e.g. carbon monoxide or hydrogen) at high temperatures (e.g. greater than about 400° C.), the rutile material shows, when returned to room temperature, increased conductivity. Referring to the formula TiO$_x$, values of conductivity range over many orders of magnitude as x is varied between 2.00 and 1.75.

In view of this behavior, TiO$_x$ is considered to be a defect semiconductor. That is, microstructures or defects due to oxygen vacancies within the material are responsible for this behavior. The defects tend to organize into planar defect structures and, in certain temperature ranges, phases with intermediate compositions, Ti$_n$O$_{n-1}$, may form and be stable. Furthermore, a transformation of defect structures called "crystallographic shear" is known to take place in the TiO$_x$ material. The crystallographic shear transformation converts a planar array of oxygen vacancies into a planar array of titanium interstitial ions. Quasi-ferroelectric phenomena have been observed in samples of platinum doped TiO$_x$. These quasi-ferroelectric phenomena are indicators that, at the microscopic level, behavior similar to that observed for polar materials can occur in platinum doped TiO$_x$. It is suggested that the polar behavior is the result of introducing PtTi$_3$ planar layers into the crystalline structure. That is, the interfacial layer between the TiO$_2$ rutile and the PtTi$_3$ is believed to be the seat of the polar behavior.

All the titanium dioxide ceramic pellets have platinum (Pt) present in some form. The form of platinum present in the material is important because the reaction that takes place between Pt and Ti under certain conditions produces a solid, semiconductor ceramic with an asymmetrical direct current conductivity. Platinum in the starting pellet can be present only in the lead wires. Alternatively, platinum can be present at the start both in the lead wires and in the form of fine particles (about 0.1 to 0.5 micron diameter) dispersed throughout the ceramic body.

The particular treatment, in accordance with an embodiment of this invention, that produces titanium dioxide ceramic with electrical rectification characteristics includes the following steps:

(1) Connect the leads of the smaple to a source of 1 volt dc and leave the voltage applied during all the subsequent steps described here.

(2) Heat the sample to a temperature between 750° to 850° C.

(3) While the sample is above 750° begin cycling the sample between oxidizing (4% $O_2$ in $N_2$) and reducing (2% CO in $N_2$ or 2% $H_2$ in $H_2$) atmospheres. The total time for a complete oxidation-reduction cycle is about 4 minutes, and the number of cycles is about 100.

(4) Lower the temperature, continuing to cycle the sample, until temperature of approximately 600° C. is reached.

(5) Around 600° C., stop cycling and place the reducing atmosphere over the sample. Allow the smaple to cool back down to room tempertature in the presence of the reducing atmosphere.

Before this treatment is begun, a pellet of titanium dioxide ceramic normally has a resistance of about 50 megohms or greater and shows no asymmetry in conductivity. After being subjected to the treatment described, the low resistance direction (forward direction) of current flow can be as low as about 5,000 ohms, with a resistance in the direction of reverse current flow up to twenty times larger than the forward direction. Thus, after the treatment just outlined, the material has a rectification characteristic and a room temperature conductivity in the forward direction that is about four orders of magnitude larger than that in the untreated material.

As a result of fabrication in accordance with an embodiment of this invention, the rectifier structure has a symmetrical configuration with platinum as both electrodes. The cause of the rectification is ascribed to a defect microstructure that results form a combination of circumstances: (i) the presence of platinum, (ii) the presence of an electrical ordering field, (iii) the presence of the crystallographic shear phenomenon in titanium dioxide, (iv) a heat treatment that causes platinum to diffuse into the rutile grains in substantial concentrations and react with the Ti to produce microscopic layer defects of $ptTi_3$, which may be nucleated along crystallographic shear planes, but grown with an epitaxial relation to the titanium dioxide substrate in [100] direction. The current versus voltage characteristic (I-V curve) of a rectifier structure fabricated as described above is shown in FIG. 1.

The formation of the microstructural defects responsible for the asymmetrical conductivity in titanium dioxide depends upon the presence of platinum. Samples showing strong rectification characteristics have had approximately 2% platinum present in the rutile structure. The cyclic oxidation reduction process causes the platinum to react with the titanium dioxide and undergo a reduction in particle size and a dispersion (probably of platinum atoms) into the rutile crystal structure. The platinum reacts with the titanium dioxide to form an intermetallic precipitate, $PtTi_3$. This precipitate is first formed as a cloud of fine point defects in the titanium dioxide matrix. With continued cycling, the $PtTi_3$ particles agglomerate and form planar microstructures, probably under the influence of the crystallographic shear process. The microstructures can be considered to be defects in the rutile structure. The individual $PtTi_3$ planar defect structures at this point are epitaxial layers, about 30 Angstroms thick and sandwiched between rutile crystal structures. Further treatment results in the formation of multiple layered planar microstructures.

The sequence of microstructures or defects formed by the cyclic oxidation reduction heat treatment described in the preceding paragraph is outlined in the drawings of FIGS. 2a, 2b, 2c and 2d. FIG. 2a shows an overall view of a collection of grains indicating that, probably as a result of varying impurity concentrations, the grains are in various stages of developing the microstructural defects. FIG. 2d indicates that the expitaxial layers are on (100) faces with the normal to these planes corresponding to a [010] direction in both the $TiO_2$ and $PtTi_3$ crystal structures.

The defect structures that are most responsible for the rectification effect are probably those in FIG. 2c. These single layered structures will have the greatest surface area to volume ratio. The interface between the $PtTi_3$ layer and the rutile matrix is probably the seat of the polar phenomena, possibly involving a polar compound of the form $PtTiO_3$. The electric field applied during the heat treating process serves to align the polar intermetallic layer for whatever defects are suitably oriented relative to the applied field. Careful examination of the arrangement of the microstructural defects over the extension of the region between the lead wires does not indicate any tendency for the applied field to influence the orientation of the planar defect structures.

In accordance with another embodiment of this invention, fabricating Pt-doped $TiO_{2-x}$ ceramic rectifiers is based on a tape casting method presently used to fabricate the ceramic material used in $TiO_2$ exhaust-gas-oxygen sensors. The major processing steps are outlined below and illustrated in FIGS. 3a, 3b, 3c and 3d.

A tape 31 is formed by starting with $TiO_2$ powder and calcining at 1150° C. for 2 hours. The calcined powder is mized with water and ball milled for 16 hours. The $TiO_2$ dried powder is mixed with solvents and binder and again ball milled, deaired, and finally the ceramic slurry is metered onto a cellulose triacetate plastic sheet 32 to form a tape of ceramic about 0.020" thick.

Relatively large area ceramic pieces 33, about 1 inch square, are cut from the plastic tape and fired at 1250° C. Platinum electrodes about 0.00005" thick are sputter deposited on the major faces of the ceramic piece. With the platinum electrodes on the major faces, the material is subjected to the heat treatment procedure given previously.

Figure 3A:
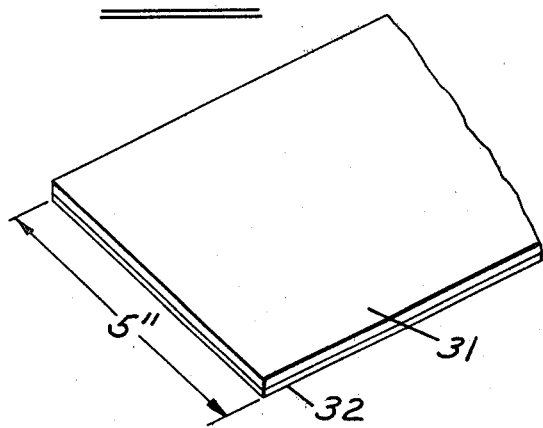
FIGS. 3a, 3b, 3c, and 3d are perspective representations of various stages of fabrication of a rectifier in accordance with an embodiment of this invention.
Figure 3B:
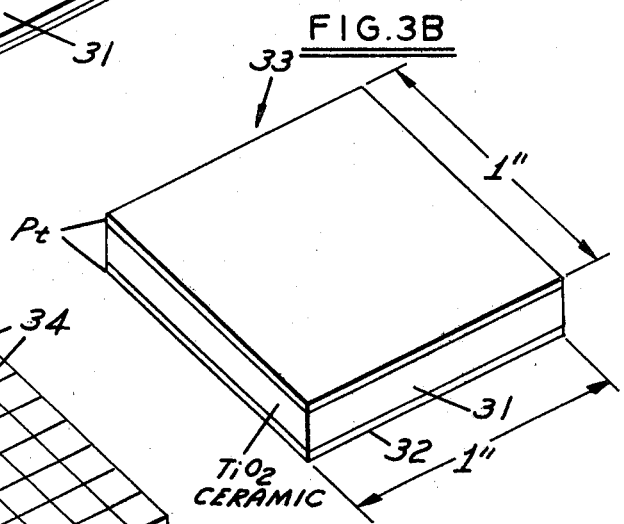
Figure 3C:
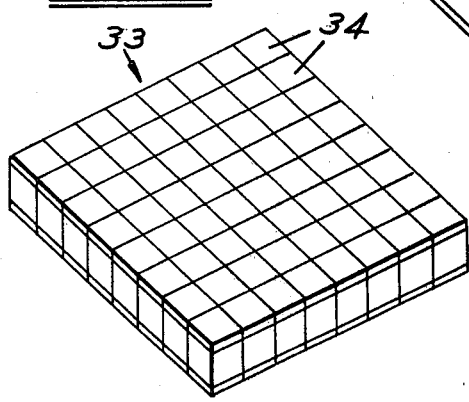
Figure 3D:
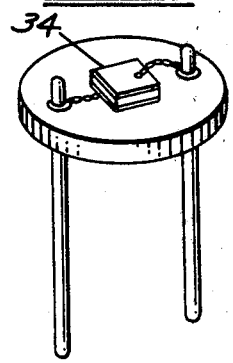

After heat treatment, the 1 inch square piece 33 is sliced into small square wafers 34 of ceramic (FIG. 3c) lead wires are bonded to the Pt electrodes, and the ceramic wafer is packed in a conventional diode or transistor mounting structure (FIG. 3d).

Various modifications and variations will no doubt occur to those skilled in the art. Useful devices may be achieved in ceramic oxides other than $TiO_2$ since there is some experimental evidence that Pt and Pd can form polar interfacial layers with oxides of other tetravalent metal atoms. Further, improvement in the performance of the Pt doped $Tio_{2-x}$ rectifying devices is expected to be obtained by refining the processing in such a way that the ceramic has in its final condition most of its grains with the thin single layer defect structures illustrated in FIG. 2c. These and all other variations which basically rely on the teachings through which this disclosure has advanced the art are properly considered with the scope of this invention as defined by the appended claims.

What is claimed is:

1. A method for making a rectifier circuit element comprising the steps of:
    forming a structure with a porous, fine-grain, polycrystalline ceramic oxid main body with a pair of spaced faces and a platinum contact electrode on each of the spaced faces;
    applying a dc voltage across the structure;
    heating the structure to a temperature of about 750° to 850 ° C.;
    applying an oxidizing atmosphere;
    applying a reducing atmosphere;
    cycling between oxidizing and reducing atmospheres to form planar microstructures; and
    cooling the structure.

2. A method for making a rectifier as recited in claim 1 wherein:
    said steps of applying an oxidizing atmosphere and applying a reducing atmosphere are alternated so that said cycling occurs about 100 times and the total time for a complete oxidation reduction cycle is about 4 minutes.

3. A method for making a rectifier as recited in claim 2 wherein the step of cooling the structure includes lowering the temperature of the structure to about 600° C. while alternating the reducing and oxidizing atmospheres, further lowering the temperature from 600° C. to room temperature occurring in the presence of the reducing atmosphere.

4. A method for making a rectifier as recited in claim 3 wherein the step of applying a dc voltage includes applying substantially one volt to the electrodes.

* * * * *